United States Patent
Choi et al.

(12)

(10) Patent No.: US 6,440,637 B1
(45) Date of Patent: Aug. 27, 2002

(54) ELECTRON BEAM LITHOGRAPHY METHOD FORMING NANOCRYSTAL SHADOWMASKS AND NANOMETER ETCH MASKS

(75) Inventors: Sung H. Choi, Los Angeles; Martin S. Leung, Redondo Beach; Gary W. Stupian, Hermosa Beach; Nathan Presser, Los Angeles, all of CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 09/613,051

(22) Filed: Jun. 28, 2000

(51) Int. Cl.[7] .................................................. G03C 5/00
(52) U.S. Cl. ........................ 430/296; 430/312; 430/314; 430/316; 430/942

(58) Field of Search .................................. 430/296, 311, 430/312, 313, 314, 316, 942

*Primary Examiner*—Christopher G. Young
(74) *Attorney, Agent, or Firm*—Derrick Michael Reid

(57) ABSTRACT

A process for forming a nanocrystal nanostructure is repeated for growing the nanostructure disposed on an electron beam resist layer that is disposed on a substrate for forming an electron beam shadowmask from the nanostructure on the electron beam resist layer prior to electron beam exposure for patterning the electron beam resist layer in advance of subsequent processing steps. The nanocrystals are semiconductor materials and metals such as silver. The nanostructure enable the creation of ultra-fine nanometer sized electron beam patterned structures for use in the manufacture of submicron devices such as submicron-sized semiconductors and microelectromechanical devices.

9 Claims, 3 Drawing Sheets

MODIFIED LIFT-OFF PROCESS

TRANSFER WIRE PATTERN

GROW WIRE PATTERN

E-BEAM EXPOSE SHADOW MASK PATTERN

DEVELOP E-BEAM RESIST

ELECTRON BEAM LITHOGRAPHY METHOD FORMING NANOCRYSTAL SHADOWMASKS AND NANOMETER ETCH MASKS

STATEMENT OF GOVERNMENT INTEREST

The invention was made with Government support under contract No. F04701-93-C-0094 by the Department of the Air Force. The Government has certain rights in the invention.

FIELD OF THE INVENTION

The invention relates to the field of electron beam lithography. More particularly, the present invention relates to the formation of nanostructures using nanocrystals forming shadowmasks for masking electron beam radiation during electron beam lithography.

BACKGROUND OF THE INVENTION

Low dimensional semiconductor nanostructures are used in electronic, optoelectronic and magnetoelectronic devices. To fabricate semiconductor structures in the nanometer range, it is necessary to develop lithographic techniques with nanometer-scale resolution. Much effort has been made in fabricating nanometer-scale structures using high-energy, highly defined sources such as electron beams and X-rays. The proximity effect, caused by the high-energy sources, limits the resolution of lithography. Scanning techniques with a low energy source, such as scanning tunneling microscope lithography, are not suitable for high throughput. Self-assembly techniques may be utilized to produce shadowmasks that are characterized by periodic, nanometer-scale patterns. Block co-polymers, for example, will phase separate into structures with nanometer-scale periodicities. However, these organic materials result in poor contrasting shadowmasks. Another option is to use higher-contrast inorganic systems. Organically functionalized metal and semiconductor nanocrystals in the two to one hundred nanometer range can assemble into a variety of organized structures, including lamellar wire-like phases. These structures usually consist of self-oriented high-aspect ratio nanocrystals that can be transferred as a Langmuir-Schaeffer film during a Langmuir-Blodgett lift-off process of the film onto substrates of virtually any size. The Langmuir-Blodgett lift-off process has been used to create nanostructures on a substrate bonded to a transfer tool. The Langmuir-Blodgett lift-off process has not been used to create nano sized semiconductor devices.

Nanometer sized film structures, such as strands and dots have been created. These strands and dots have been used for testing predictions of quantum confinement and reduced dimensionality as potential building blocks for nanostructure materials. Nanostructure materials have not been used to create nano size semiconductor devices in the electronics industry. In particular, semimetallic bismuth with very small effective mass and high carrier mobilities is a suitable material for studying quantum-confinement effects in one-dimensional systems and is a promising material for thermoelectric applications. However, semimetallic and silicon based materials have not used to form semiconductor devices on substrates during convention photolithographic processing. These and other disadvantages are solved or reduced using the invention.

SUMMARY OF THE INVENTION

An object of the invention is to provide a method for creating nano size semiconductor structures.

Another object of the invention is to provide a method creating nano size electron beam lithography shadowmasks.

Yet another object of the invention is to provide a method creating nano size etch masks using electron beam lithography.

The method is used for fabricating precisely defined nanometer scale photoresist patterns and semiconductor devices. The Langmuir process is utilized to form high aspect ratio lamellae or wire-patterns of silver nanocrystals on the surface of water. The patterns are transferred onto resist-coated substrates as a Langmuir-Schaeffer for producing a shadowmask. The nanostructure patterns are transferred to the photoresist material by spatially selective electron beam exposure on the silver nanocrystal nanostructure shadowmask. The invention forms nanocrystal structures as resist shadowmasks having a predetermined patterns for blocking electron beam exposures. The combined use of low energy electron beam exposure and self-assembled nanocrystal shadowmasks provide a low-cost fabrication technique for forming semiconductor nanometer scale nanostructures.

The low cost and high resolution exposure shadowmask is suitable for low energy electron beam lithography. Nanocrystal assembled dot and wire nanostructures can be used as a shadowmask during low energy electron beam lithography. Oriented nanometer-size dot and strands nanostructures are readily transferred onto a wafer that may be several inches in diameter. Nanocrystal based nanostructures including strands and dots are useful in the processing of nano sized semiconductor devices. The method generates oriented continuous self-assembled nanostructures of semiconductor or metallic materials for used in semiconductor device fabrication. Nanocrystals linked with ligands, such as thiol tails, are fabricated using an organically functionalized nanocrystal solution. Arrays of dots and strands form spontaneously on the surface of water in a Langmuir-Blodgett trough when the nanocrystals in solution are dropped onto the surface of the water in the trough. The nanocrystal structures are then transferred onto electron-beam sensitive photoresist coated substrates by the Langmuir-Blodgett lift-off process, with the modification of firstly depositing an electron beam resist on the substrate. To prepare a thick nanocrystal shadowmask, multiple layers of nanocrystals are added to the previously deposited layer to increase the size of the nanostructure. The nanocrystal patterns are transferred to the photoresist film during electron beam exposure. Spatially selective electron beam exposure on the nanocrystal shadowmask serves to selectively expose the resist layer. Developing the exposed resist layer results in a resist patterned etch mask suitable for further processing during the fabrication of nano sized semiconductor devices. Using the nanocrystal shadowmask, a 50 nm size polymethyl methacrylate (PPMA) nano sized etch mask can be produced for creating a similarly sized device such as a quantum wire or nano wire using reactive ion etching. Very small 15 nm size PMMA dot patterns can also be formed by the method. The PMMA resist pattern etch mask is obtained using the nanocrystal shadowmask. The etch mask is used masking the reactive ion etching or other processes step during further processing of the substrate. The resist etch mask can be used to pattern the substrates, for example, a silicon substrate etch by a subsequent anisotropic reactive ion etching process that is used to form nanowires under the etch mask.

Hence, the nanocrystal strand nanostructure form predetermined patterns that are effectively transferred onto the PMMA coated silicon wafer for patterning the substrate with nanometer scale resolution. The low energy electron beam exposes negative portions of the nanocrystal shadowmask on the resist layer on the substrate. After exposing the resist layer, the resist is then developed for removing exposed portions of the resist to expose a portion of the substrate for reactive ion etching. The method allows for the creation of nano sized structures in a semiconductor substrate for forming nano sized devices. The method uses low energy electron beam exposure that reduces the proximity effects. The method is suitable for low cost and high throughput fabrication of semiconductor nanometer scaled structures and devices. These and other advantages will become more apparent from the following detailed description of the preferred embodiment.

DETAILED DESCRIPTION OF THE PREFERRED EMBODIMENT

Figure 1:
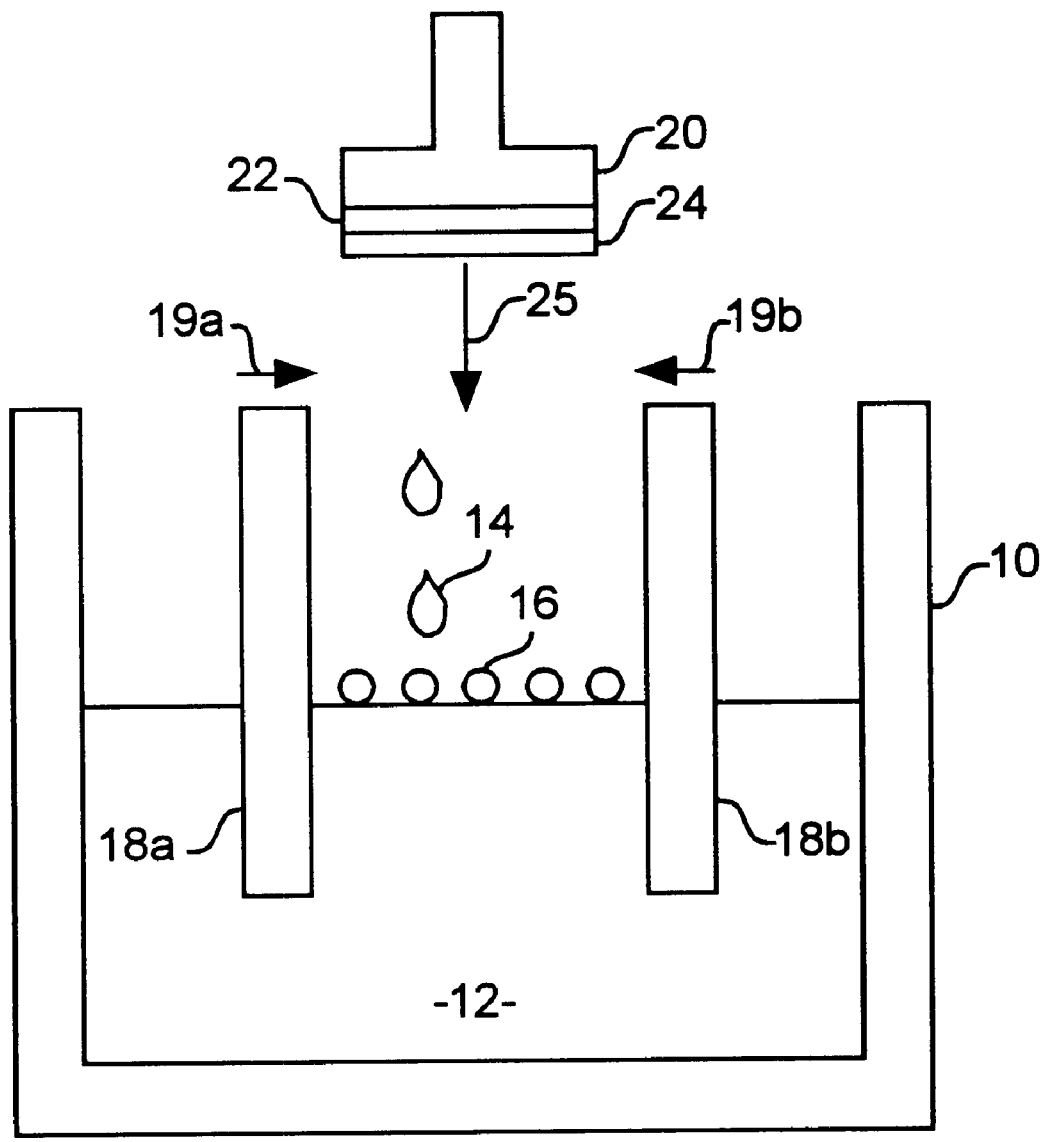
FIG. 1 is a diagram depicting a modified Langmuir-Blodgett lift-off process for forming nanocrystal structures, the modification being the addition of the resist layer upon which is transferred the nanostructures.
Figure 2:
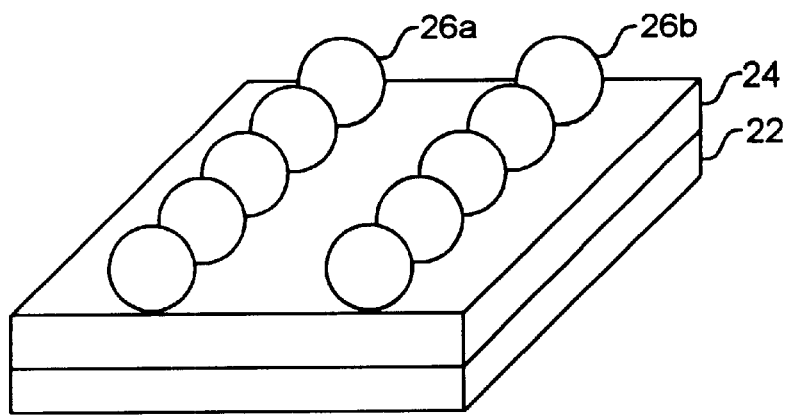
FIG. 2 is a diagram depicting transfer of a nanocrystal nanostructure onto an electron beam resist layer disposed on a substrate.
Figure 3:
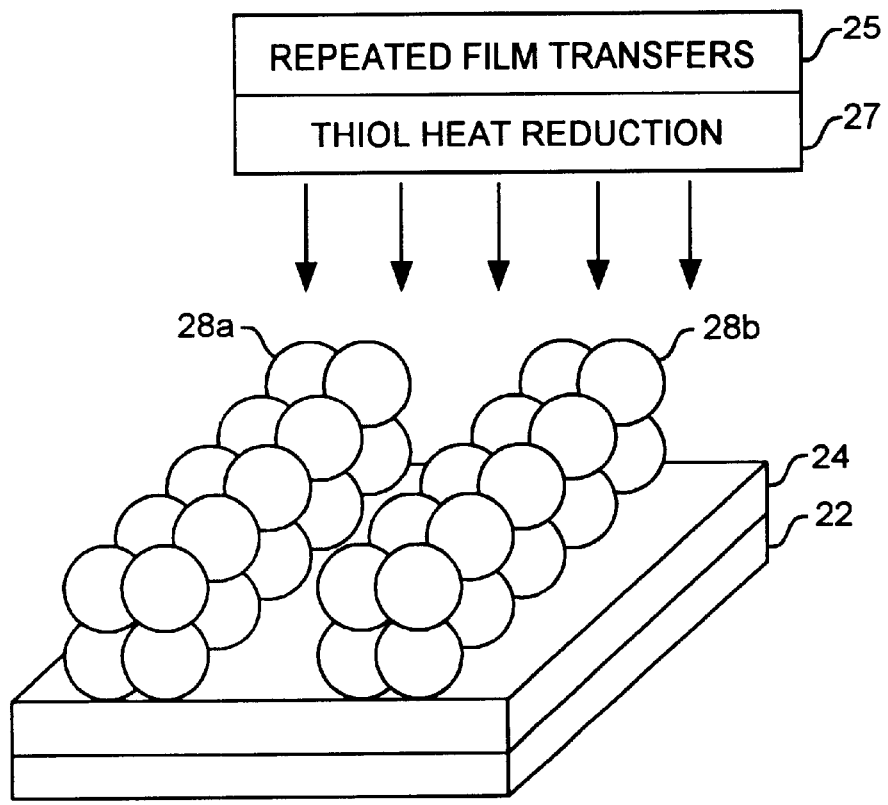
FIG. 3 is a diagram showing growth of the nanostructure during repeated transfers of nanocrystal nanostructure.
Figure 4:
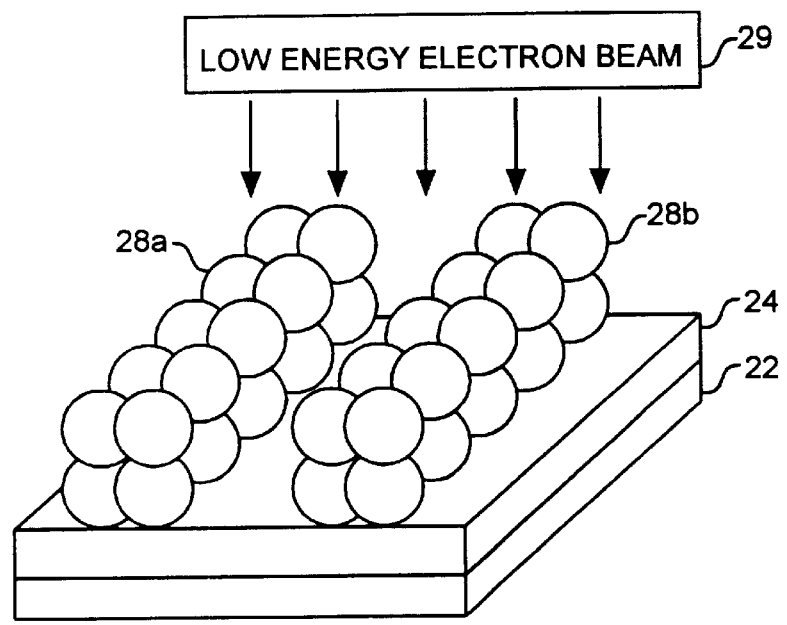
FIG. 4 is a diagram depicting Electron beam exposure during an electron beam lithography process step to form a patterned layer of electron beam resist.
Figure 5:
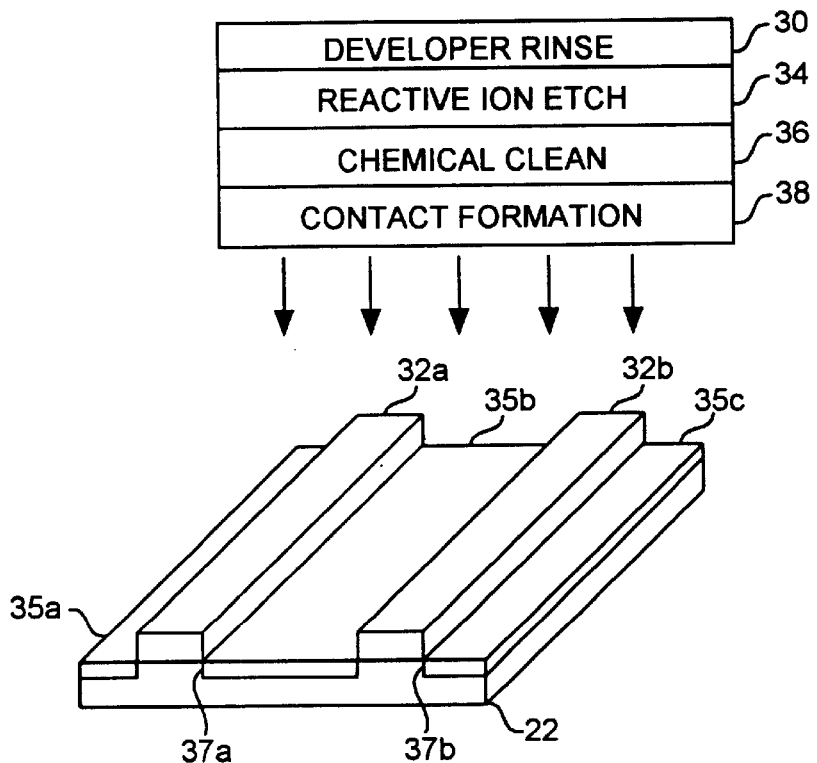
FIG. 5 is a diagram depicting electron beam development during an electron beam lithography process step to form a patterned layer of electron beam resist.

An embodiment of the invention is described with reference to the figures using reference designations as shown in the figures. Referring to all of the Figures, a Langmuir-Blodgett trough 10 is filled with water 12 and a nanocrystal solution 14 is dropped into the water 12 to form nanocrystal film 16. Left pressure bar 18a and right pressure bar 18b are pushed together 19a and 19b to cause the film to condense into the nanocrystal film 16. A transfer tool 20 having a substrate 22 is brought down upon the film 16 between the left and right pressure bars 18a and 18b. The film 16 comprises nanocrystal particles that are oriented in a predetermined pattern, for examples, in arrays of dots and strands. In the preferred from of the method, the nanocrystal particles form parallel elongated strands. When the substrate 22 makes contact 25 with the nanocrystal film 16, the nanocrystal film 16 adheres to the substrate 22 forming nanocrystal strands 26a and 26b and are lifted up and removed from the surface of the water 12 when the substrate 22 is withdrawn up and away from the water 12 out of the trough 10. Prior to transferring 25 the nanocrystal particles onto the substrate 22, a resist layer 24 is deposited on the substrate 22. The resist layer 24 is preferably an electron beam resist layer. The nanocrystal strands 26a and 26b are transferred 25 as aligned in the predetermined shadowmask pattern of the film 16. In the preferred form, the nanocrystal patterns are elongated wire-like strands 26a and 26b running longitudinally along the surface of electron beam resist layer 24. The transferred tool 20 is repeated lowered 25 down into the trough 10 a plurality of times to repeatedly make contact 25 with the film 16. Each time the tool 20 is lowered 25, more of the nanocrystal particles adhere to the existing strands 26a and 26b causing the strands 26a and 26b to dimensionally grow in size as enlarged strands 28a and 28b.

The nanocrystal particles have linking thiols that are reduced by heating 27 to a temperature between 100° C. and 150° C. The Thiol reduction 27 reduces the distance between the enlarged strands 28a and 28b as a reduction of line spacing of the shadowmask. After growing the enlarged strands 28a and 28b to a desired thickness in diameter, the substrate 22 is removed from the transferred tool 20. The enlarged strands 28a and 28b are exposed by low energy electron beam illumination 29, for example, between at 500 V to 700 V. During illumination 29, the enlarged strands 28a and 28b block the electron beam radiation from illuminating the resist 24 on the substrate 22 under the enlarged strands 28a and 28b functioning as an electron beam shadowmask. The electron beam illumination 29 of the electron beam resist 24 serves to break chemical bonds of the resist 24. A developer rinse 30 is then applied to the illuminated resist 24 for removing exposed illuminated portions of the resist 24 to form a resist pattern comprising resist traces 32a and 32b that then function as an etch mask. Those skilled in the art of semiconductor processing are well adept at applying electron beam illumination 29 and developer rise 30. Reactive ion etching 34 removes exposed substrate portions 35a, 35b and 35c to thereby pattern the substrate for further processing. The electron beam resist etch mask 32a and 32b is then removed using a conventional chemical cleaning 36 thereby creating a patterned substrate 22 having elevated portions that function as elongated quantum wires or nanowires 37a and 37b as exemplar but simple semiconductor devices. The patterned substrate 22 can be further processed to use these nanowires 37a and 37b. For example, electrical contacts can be deposited 38 for interconnecting the nanowires 37a and 37b. It should now be apparent that other conventional types of processing steps can be used to form other types of semiconductor devices using conventional processing steps utilizing nanometer sized shadowmasks and etch masks.

In the preferred form of the invention, the method can be used to form a small size nanostructure using silver nanocrystal particles. For example, 3 nm diameter octanethiol-capped silver nanocrystals are mixed into a 1 mg/ml hexane solution to form the nanocrystal solution 14. The Langmuir films 16 are formed in a Nima Technology type 611 Langmuir trough 10 at 15° C. The nanocrystal solution 14 is a hexane nanoparticle solution comprising decanedithiol ($HSC_{10}H_{20}SH$) and hexane nanoparticles. Typically, only one drop which is approximately 3 μl of the silver nanocrystal solution 14 is dispersed on the surface of the water 12. The nanocrystals in the solution 14 spontaneously self-assembled into high-aspect ratio wire-like structures. The water surface forces cause interactions among the nanocrystals on the water surface causing the nanocrystals to disperse as wire-like strands. The width of the strands of the film 16 can be controlled from 20 nm to 300 nm depending on the size of the nanocrystal particles and depending on the pressure 19a and 19b applied by the pressure bars 18a and 18b. For a given set of wires, a narrow distribution of widths, for example 15–25% in width variances can be obtained. The interstrand distance, as well as the alignment of the strands 16, can be controlled via compression 19a and 19b from the pressure bars 18a and 18b in the Langmuir trough 10. During film transfer 26, the nanocrystal nanostructures 26a and 26b retain the film structures and aligned with interwire separations of a few nanometers. The nanocrystal Langmuir film 16 is transferred onto the polymethyl methacrylate (PMMA) electron beam resist 24 that coats the substrate 22. The nanocrystal shadowmask pattern defined by enlarged strands 28a and 28b is grown by repeatedly lowering 25 the substrate 22 with the resist 24 into contact with film 16 on the water 12. This film transfer amplification 25 slightly increased the width of the enlarged strands 28a and 28b during each transfer step 25 immersion as the nanoparticles bond together. The nanocrystal particles comprise a few hundred atoms, such as silver atoms. Thiol tails, not shown, extend from the particles 28a and 28b to which additional particles are drawn and bonded during the growing process 25. The growth can double the height of the wires 28a and 28b to about 18 nm. Hence, the method involves transferring 25 of nanocrystal nanostructures onto the PMMA electron beam resist 24, amplifying 25 the nanostructures to a desired thickness as a shadowmask, exposing 29 the shadowmask 28a and 28b and electron beam resist 24 to low energy electron beams for the formation of the PMMA etch mask pattern 32a and 32b after developing 30. Scanning electron microphotography shows that 50 nm wide PMMA wire patterns can be formed by a silver nanocrystal shadowmask after developing process. After forming the nanostructured resist pattern 30a and 30b as a shadowmask, the substrate 22 can be processed to form a variety of semiconductor devices. As shown, reactive ion etching 34 is used to etch exposed substrate portions 35a, 35b and 36c. After etching away the exposed substrate portions 35a, 35b and 35c, the resist 32a and 32b can be removed 36 using conventional chemical cleaning processes, thereby exposing nanowires 37a and 37b formed in the substrate 22.

The low energy electron beam exposure 29 is used because low-energy electrons have less lateral scattering, higher interaction cross-sections, and shorter substrate penetration depths than the higher-energy electrons used in conventional electron beam lithography. To estimate the electron stopping power for silver nanocrystals, the formula for the electron range $\rho R$ given by $\rho R=0.0276 AE^{1.67}/Z^{0.889}$ where R in $\mu m$ is the stopping depth, A is a constant, E is the acceleration voltage in KV, Z the atomic number, and $\rho$ is the density in $g/cm^3$. The estimated electron stopping effective range R for silver at 700 V is 4 nm and is less than the thickness of the silver nanocrystal nanostructures. A Monte Carlo approach with more than $10^5$ electron trajectories through the silver can be used to evaluate the electron stopping power of the silver nanocrystal shadowmask. This penetration depth is greater than the diameter of silver nanocrystals 26a and 26b but is smaller than the thickness of the amplified nanocrystal nanostructures 28a and 28b. A JEOL 6401F field emission scanning electron microscope can be used to expose 29 the substrate 22 to a 600pA 700 V electron beam with the field size of 100 $\mu m$ ×100 $\mu m$ for ten minutes to expose the PMMA 24 with an electron dose of 50 $\mu C/cm^2$. At 700 V, only very thin resist films 24 of less than 50 nm can be exposed. The silver nanocrystal strands 28a and 28b of 4 nm thin 50 nm wide form the showdown that was transferred onto the PMMA coated substrates 22 by the Langmuir-Blodgett trough lift-off process 25. For improved pattern transfer, a thicker shadowmask is preferred and accomplished by the amplification 25 of the shadowmask thickness. Because the top of the silver nanocrystal nanostructures 28a and 28b are hydrophobic, multiple nanostructure layers of silver nanocrystal particles can be added to the previously deposited nanostructure layer by repeating the Langmuir-Blodgett trough lift-off process. The amplified silver nanocrystal structures 28a and 28b are kept in air for a few days to allow for organic ligands to evaporate during a chemical metalization process. This metalization process can be accomplished quickly through direct heating 27 to reduce the ligand thiols. The areas occupied by the organic ligands between the nanocrystals in the nanostructures 28a and 28b decreased through the metalization evaporation process 27. As a result of the amplification 25 and metalization process 27, 10 nm high silver nanocrystal nanostructures 28a and 28b are formed as enlarged strands with a reduction in the interwire distance. The amplified and metallized silver nanostructures 28a and 28b and the PMMA resist 24 are then exposed to a low energy electron beam 29. Following the electron beam exposure 29, the resist 24 is developed for one minute in a mixture of methyl isobutyl ketone and isopropanol with a ratio 1:3. Scanning electron microphotography can depict the 50 nm wide and 10 nm high PMMA etch mask pattern 32a and 32b fabricated using the silver nanocrystal shadowmask 28a and 28b after developing process 30. As such, nanometer size etch mask 32a and 32b has been created using the nanometer size shadowmask 28a and 28b and the low energy electron beam exposures 29.

The patterned resist 32a and 32b on the substrate 22 can be further processed to create semiconductor devices. For example, a subsequent anisotropic reactive ion etching process 34, with a chlorine tetrafluoride $CF_4$ to oxygen $O_2$ mixture of 22 mtorr to 18 mtorr, and the plasma sustaining power of 150.0 watt is used to etch away exposed portions 35a, 35b and 35c of the substrate. Next, the resist etch mask pattern 32a and 32b is removed by cleaning 36 resulting in 50 nm wide silicon nanowires 37a and 37b that are nanometer size semiconductor devices. The nanowires 37a and 37b can be interconnected by depositing contacts 38 at the ends of the nanowires 37a and 37b.

As may now be apparent, the method enables the formation of a parallel array of 50 nm wide PMMA etch mask patterns 32a and 32b by using a low energy electron beam exposure 29 of silver nanocrystals strands 28a and 28b functioning as an electron beam shadowmask. The photoresist etch mask patterns 32a and 32b are obtained by using the nanocrystal shadowmask to transfer the shadowmask pattern 28a and 28b onto silicon substrates resulting in the formation of the nanowires 37a and 37b during the subsequent reactive ion etching process 34. An advantage of the method in forming the quantum nanowires is the use of low energy electron beam exposure that reduces the proximity effects. The method is especially suitable for low cost and high throughput fabrication of quantum nanowires.

Field emission scanning electron microscopy micrographs can be used to image the transferred silver nanocrystal shadowmask pattern formed from the film 16. The nanocrystal film 16 is transferred onto the substrate at a surface pressure 19a and 19b of 15–20 mN/m prior to microphotography provided by the pressure bars 18a and 18b. In the preferred form, the method is a procedure of low energy electron beam lithography for creating a silver nanocrystal shadowmask through transfer of silver nanocrystal nanostructures 26a and 26b on the PMMA resist 24 disposed on the substrate 22. The preferred form of the method enables the formation of metallized and amplified silver nanocrystal nanostructures 28a and 28b. The wire-like nanostructure 26a and 26b have a narrow distribution of wire widths and the wires can be as long as 1–2 $\mu m$ length and aligned into a regular pattern along the substrate 22.

The method for fabricating nanometer size polymethyl methacrylate (PMMA) etch mask patterns using silver nanocrystal shadowmasks can be applied to many types of semiconductor processes. The method can be also applied to create more complex semiconductor devices of different materials. For example, the method can be used to produce bismuth nanowires 37a and 37b by filling porous anodic alumina with bismuth from the liquid phase resulting in single-crystal nanowire arrays having the same crystal structure and lattice parameters as a bulk material. A 40 nm thick bismuth single-crystal film, not shown, but in the position of nanowires 37a and 37b is formed on the substrate 22 by molecular beam epitaxy deposition. The substrate 22 may be an indium doped semi-insulating CdTe(111)B substrate that is one square centimeter in size. X-ray diffraction can be used to show sharp (0001) peaks that implied c-axis growth of the bismuth layer perpendicular to the substrate 22. The bismuth nanowires 37a and 37b can be fabricated using low energy electron beam lithography using the silver nanocrystal shadowmasks and a subsequent chlorine reactive ion etching 34. The reactive ion etching 38 is used to form the bismuth nanowires 37a and 37b under the etch mask 32a and 32b. Submicron-size metal contacts 38 are deposited on the ends of the bismuth nanowires 37a and 37b through an in-situ focused ion beam metal deposition 38. Two 100 nm wide platinum contact pads are deposited 38 on the ends of each of the bismuth nanowires 37a and 37b. The temperature dependent resistance measurements on the 50 nm wide bismuth nanowires 37a and 37b show that the resistance increased with decreasing temperature, which is characteristic of semiconductors and insulators. Self-assembled high-aspect ratio silver wire structures are transferred to a 40 nm thick 1% PMMA coated molecular beam epitaxy grown bismuth layer on the CdTe substrates. Substrates with the transferred silver wires are exposed by the JEOL 6401F field emission scanning electron microscope at 700 V to provide the resist 24 with an electron dose of 50 $\mu$C/cm$^2$. At 700 V, the 40 nm thick PMMA resist 24 can be exposed all the way to the surface of bismuth film. The penetration depth of electrons in silver was found to be 4 nm at 700 V by the previous Monte Carlo simulation. That penetration depth is smaller than the thickness of silver nanocrystal shadowmask 28a and 28b. Following the electron beam exposure 29, the resist 24 is developed 30 for one minute in a mixture of methyl isobutyl ketone and isopropanol in the ratio 1:3. A subsequent anisotropic reactive ion etching process 34 may be carried out by a PlasmaMaster model PME 1200 chlorine etcher. With a $BCl_3$ to $Ar_2$ mixture at 20 mTorr, and a plasma sustaining power of 200 W, reactive ion etching process transferred the silver nanowire resist etch mask pattern into the bismuth layer and CdTe substrate 22. The shadowmask material consists of 30 nm thick silver on the 40 nm thick PMMA resist 24. The electronic orbital configuration of bismuth implies that bismuth prefers to have two ionization states. A simple model of the bismuth etching mechanism for the case of $Bi^{+3}$ ionization state is proposed: $Bi \rightarrow Bi^{+3}+3e-$, $3/2\ Cl_2+3e- \rightarrow 3Cl^{3-}$, $Bi+3/2Cl_2 \rightarrow Bi^{+3}+3Cl^+ \rightarrow 3BiCl_3$ (Volatile). Following the formation of $Bi^{+3}$ and $Cl^{-3}$ ions by plasma, volatile products of $BCl_3$ are formed and washed away. The Argon gas in the etch gas mixture might contribute to a reduction of any undercut profile. A mixture of bismuth chloride $BCl_3$ and argon $Ar_2$ is a suitable choice of gases to be used in reactive ion etching 34 of bismuth layer producing vertical profiles and etching rates at about 100 nm/min. Through the reactive ion etching process, 50 nm wide and 40 nm high bismuth nanowires 37a and 37b can be fabricated on CdTe substrates 22. After cleaning the resist 36, submicron-size platinum contacts 38 are deposited on the bismuth nanowires. The contacts are prepared in situ focused ion beam epitaxy metal deposition at 25kV and 6 pA. The electrical resistance of the nanowires 37a and 37b can be measured and is typically on the order of 1–20 Ohms. The resistance of the nanowires increases with decreasing temperature that is characteristic of semiconductors and insulators. As quantum confinement is introduced into the bismuth nanowires, the external conduction subband and valence subband edges move in opposite directions to eventually form a positive energy band gap (Eg) between the lowest L-point conduction subband edge and the highest T-point valence band edge, thereby leading to a semimetal-semiconductor transition at Eg=0 as the nanowires size is decreased below the critical wire width of bismuth with the bismuth making a transition at a critical wire radius of 52 nm. In the bismuth nanowires 37a and 37b, the carrier mobility is suppressed by carrier confinement along the direction of wire and by surface imperfection. As such, 50 nm wide bismuth nanowires can be fabricated by low energy electron beam lithography using silver nanocrystals as a shadowmask and a subsequent chlorine reactive ion etching process. Temperature dependent resistance measurements show that the bismuth nanowires fabricated have semiconductor properties rather than metallic properties. The method is suitable for fabricating bismuth nanowires as well as other nano size semiconductor devices.

The method employs the use of nanostructures for creating nano size shadowmask for forming nano size resist masks for enabling the fabrication of nano size semiconductor devices. Those skilled in the art can make enhancements, improvements, and modifications to the invention, and these enhancements, improvements, and modifications may nonetheless fall within the spirit and scope of the following claims.

What is claimed is:

1. A method of forming an etch mask on a substrate, the method comprising the steps of, depositing a resist layer on the substrate, mixing a nanocrystal solution of nanocrystal particles, forming a nanocrystal film on a water surface, the nanocrystal particles tending to separate due to water surface forces into a predetermined pattern, transferring the nanocrystal film onto the resist layer, the nanocrystal particles forming a shadowmask of the nanocrystal particles on the resist layer, repeating the transferring step, during each repeated transferring step additional nanocrystal particles of the nanocrystal film adhere to the nanocrystal particles to dimensionally increase the shadowmask, illuminating the resist layer with an active beam, the shadowmask interfering with the active beam to create exposed resist layer portions not covered by the shadowmask and unexposed resist layer portion covered by the shadowmask, and developing the resist layer to remove the exposed resist layer portion, the remaining unexposed resist layer portion forming the etch mask patterned by the shadowmask, the substrate having exposed substrate portions where the exposed resist layer was removed during developing and unexposed substrate portions where the resist was not removed during developing.

2. The method of claim 1 wherein, the nanocrystal particles comprise a metal, the resist layer is an electron beam resist layer, and the active beam is an electron beam.

3. The method of claim 1 wherein, the nanocrystal particles comprise silver, the resist layer is an electron beam polymethyl methacrylate resist layer, and the active beam is an electron beam between 500 V and 700 V.

4. The method of claim 1 further comprising the steps of,
reactive ion etching of the exposed substrate portions for patterning the substrate prior to removing the resist.

5. The method of claim 1 further comprising the steps of,
reactive ion etching of the exposed substrate portions for patterning the substrate with etched substrate portions,
cleaning the substrate for removing the exposed resist layer portion for forming a pattern in the resist layer on the substrate, and
depositing a semiconductor material on the substrate to form a semiconductor device.

6. The method of claim 1 further comprising the steps of,
reactive ion etching of the exposed substrate portions for patterning the substrate with etched substrate portions forming a nanowire in the substrate under the resist,
cleaning the substrate for removing the exposed resist layer portion for forming a pattern in the resist layer on the substrate, and
depositing a semiconductor contact material at ends of the nanowire.

7. The method of claim 1 further comprising the step of,
heating the substrate for reducing thiols extending between portions of the nanocrystal particles tending to dimensionally decrease the shadowmask.

8. The method of claim 1 wherein the nanocrystal solution comprises decanedithiol and hexane, and the nanocrystal particles comprise silver.

9. The method of claim 1 further comprising the step of,
pressuring the nanocrystal film on the water to align the nanocrystal particles into the shadowmask.

* * * * *